United States Patent
Ku et al.

(10) Patent No.: US 8,409,771 B2
(45) Date of Patent: Apr. 2, 2013

(54) LASER PATTERN MASK AND METHOD FOR FABRICATING THE SAME

(75) Inventors: Sun-Ju Ku, Paju-si (KR); Jun-Ho Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 156 days.

(21) Appl. No.: 12/973,448

(22) Filed: Dec. 20, 2010

(65) Prior Publication Data

US 2012/0082828 A1    Apr. 5, 2012

(30) Foreign Application Priority Data

Oct. 4, 2010   (KR) .................. 10-2010-0096220

(51) Int. Cl.
  *G03F 1/22*   (2012.01)
(52) U.S. Cl. ........................................... 430/5
(58) Field of Classification Search ............. 430/5, 322; 428/696, 698, 472
See application file for complete search history.

(56) References Cited

U.S. PATENT DOCUMENTS 6,780,547 B2 *   8/2004   Motonaga et al. ............. 430/5
7,132,202 B2 * 11/2006   Jung ............................... 430/5

* cited by examiner

*Primary Examiner* — Stephen Rosasco
(74) *Attorney, Agent, or Firm* — Birch, Stewart, Kolasch & Birch, LLP

(57) ABSTRACT

The present invention relates to a laser pattern mask, and a method for fabricating the same, which can prevent a laser pattern mask from being damaged by coating a protective film on a surface of a laser pattern mask for patterning an entire layer on a mother substrate at a time by laser ablation. The laser pattern mask includes a base substrate, a laser shielding pattern formed of a non-transparent metal on the base substrate to define laser pass through regions, and a protective film formed on an entire surface of the base substrate including the laser shielding pattern.

6 Claims, 4 Drawing Sheets

FIG. 5
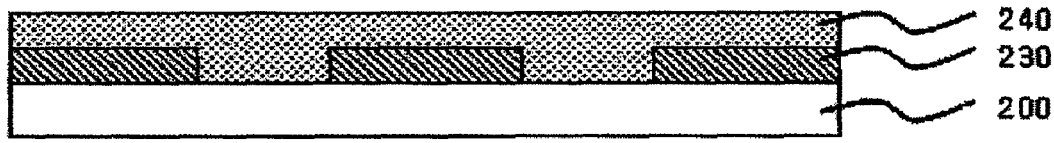
FIG. 6
| Classification | | reflectivity | Wavelength of laser beam |
|---|---|---|---|
| Laser Shielding Pattern | Protective Film | | |
| Al | $MgF_2$ | over 85% | 250nm ~ 700nm |
| Al | $SiO_2$ | over 90% | 400nm ~ 10μm |
| Ag | $SiO_2$ | over 95% | 600nm ~ 10μm |
FIG. 7A
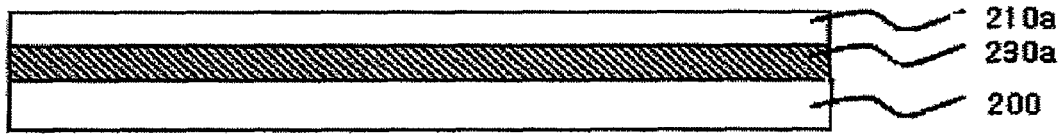
FIG. 7B
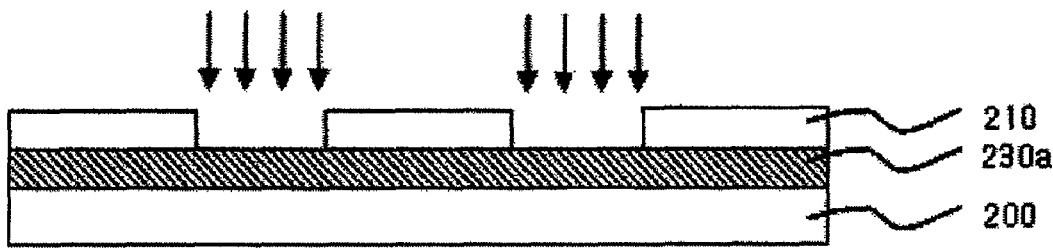

LASER PATTERN MASK AND METHOD FOR FABRICATING THE SAME

CROSS REFERENCE TO RELATED APPLICATION

This application claims the priority benefit of the Korean Patent Application No. 10-2010-0096220, filed on Oct. 4, 2010, which are hereby incorporated by reference as if fully set forth herein.

BACKGROUND OF THE DISCLOSURE

1. Field of the Disclosure

The present invention relates to a laser pattern mask, and more particularly, to the laser pattern mask which can reduce a tack time at the time a layer is patterned by laser ablation for improving a yield; and a method for fabricating the same.

2. Discussion of the Related Art

In general, as an information oriented society is developed, demands for display devices increase gradually in various forms, and to meet this demands, different kinds of flat display devices, such as LCD (Liquid Crystal Display Device), PDP (Plasma Display Panel), ELD (Electro Luminescent Display), VFD (Vacuum Fluorescent Display) and so on, have been researched, and some of which are utilized as display devices in different equipments, currently.

In general, printing process or photolithography process is used for patterning a plurality of layers of the flat display device.

In the meantime, currently, as a trend for producing larger flat display devices is continuous, and a multiple panel cutting process has been developed, in which a plurality of substrates are formed on one mother substrate for improving productivity and saving a cost of the flat display device, the laser ablation process has been developed as a method for applying the multiple panel cutting process to the trend of producing the larger flat display devices, smoothly.

The laser ablation process enables accurate and effective exposure of a layer on the mother substrate to a laser beam for patterning the layer.

A laser ablation device will be described with reference to the attached drawings.

FIG. 1 illustrates the laser ablation device, and FIG. 2 illustrates a section of a laser pattern mask in FIG. 1.

Referring to FIG. 1, the laser ablation device is provided with a light source 10, a beam shaping unit 15, a laser pattern mask 20, a beam steering unit 25, and a projection lens 30, for applying the laser beam to the mother substrate through the following steps.

The laser beam from the light source has a cross section involved in convergence or divergence as the laser beam passes through the beam shaping unit 15, and passes through the laser pattern mask 20 for patterning.

Referring to FIG. 2, the laser pattern mask 20 (See FIG. 1) has a laser shielding pattern 130 to form opened regions to the base substrate 100.

In this instance, the opened regions are regions which allow the laser beam to pass therethrough.

The base substrate 100 is formed of quartz having good light transmissivity, and the laser shielding pattern 130 is formed of opaque metal, such as chrome Cr or chrome oxide mostly, in general.

Referring to FIG. 1 again, the laser beam is involved in a direction change as the laser beam passes through the beam steering unit 25 and has magnification thereof fixed as the laser beam passes through the projection lens 30. And, as laser beam passed through the projection lens 30 thus is incident on a layer of the mother substrate 70, the layer is patterned the same as a pattern of the laser pattern mask 20.

Since the mother substrate 70 has a plurality of panels 70a, the layer is required to be patterned into a plurality of identical patterns. In this instance, the plurality of identical patterns are patterned, not at a time, but one by one while the mother substrate 70 moves in right and left directions.

In the meantime, if the layer is patterned while the mother substrate 70 moves in right and left directions, a stitching error is liable to take place, increasing a tack time to make a yield poor.

Consequently, though a method is devised, in which an entire layer on the mother substrate 70 is patterned at a time, since laser energy the same with laser energy applied to the layer of the mother substrate 70 is applied to the laser pattern mask 20, the laser shielding pattern 130 of the laser pattern mask 20 is damaged, causing a problem in that a laser shielding capability of the laser shielding pattern 130 becomes poor.

SUMMARY OF THE DISCLOSURE

Accordingly, the present invention is directed to a laser pattern mask, and a method for fabricating the same.

An object of the present invention is to provide a laser pattern mask, and a method for fabricating the same, which can prevent a laser pattern mask from being damaged at the time an entire layer on a mother substrate is patterned at a time by laser ablation process.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a laser pattern mask includes a base substrate, a laser shielding pattern formed of a opaque metal on the base substrate to define laser beam pass through regions, and a protective film formed on an entire surface of the base substrate including the laser shielding pattern.

The opaque metal is one selected from Al, Ag and Au.

The protective film is formed of $MgF_2$ or $SiO_2$.

In another aspect of the present invention, a method for fabricating a laser pattern mask includes the steps of forming a laser shielding pattern of a opaque metal on a base substrate to define laser beam pass through regions, and forming a protective film on an entire surface of the base substrate including the laser shielding pattern.

The step of forming a laser shielding pattern includes the steps of forming a laser shielding layer on the base substrate and coating photoresist on the laser shielding layer, subjecting the photoresist to exposure and development to form a photoresist pattern to have laser beam pass through regions, removing residual photoresist from the laser beam pass through regions, patterning the laser shielding layer by using the photoresist pattern to form the laser shielding pattern, and removing the photoresist pattern.

The step of removing residual photoresist from the laser beam pass through regions includes the step of using ashing or dry etching.

The step of forming the laser shielding layer includes the step of using wet etching.

The step of forming a protective film includes the step of using one process selected from CVD (Chemical Vapor Depositon), sputtering, and E-Beam.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 5 illustrates a section of a laser pattern mask in accordance with a preferred embodiment of the present invention.

FIG. 6 illustrates a table showing a test result of reflectivity of a laser pattern mask in accordance with a preferred embodiment of the present invention.

FIGS. 7A~7E illustrate sections showing the steps of a method for fabricating a laser pattern mask in accordance with a preferred embodiment of the present invention.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
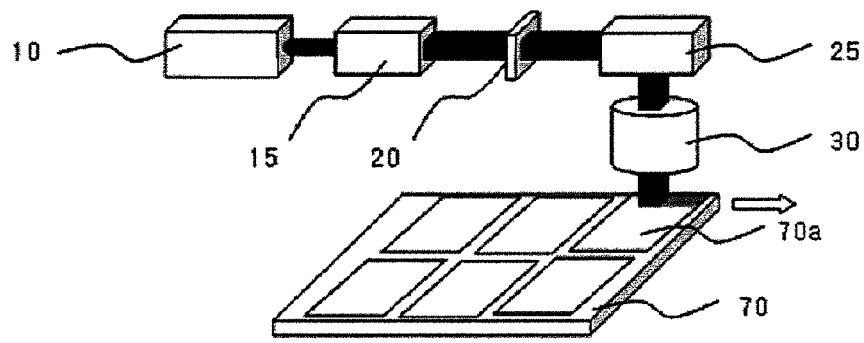
FIG. 1 illustrates a perspective view of a laser ablation device according a related art.
Figure 2:
FIG. 2 illustrates a section of a laser pattern mask in FIG. 1 according a related art.
Figure 3:
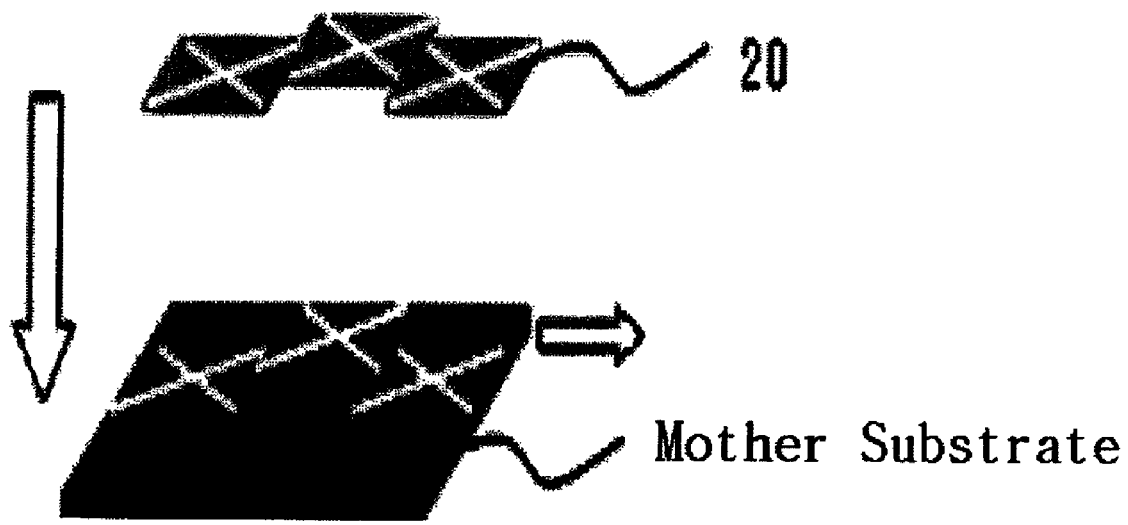
FIG. 3 illustrates a perspective view of patterning a layer one by one according a related art.
Figure 4:
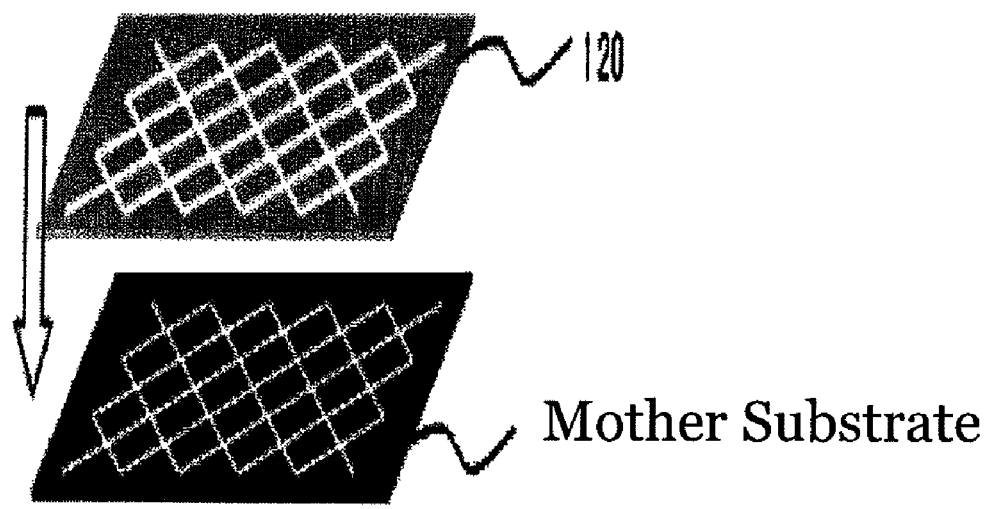
FIG. 4 illustrates a perspective view of patterning a plurality of layers at a time in accordance with a preferred embodiment of the present invention.

FIG. 3 illustrates a perspective view of patterning a layer one by one, and FIG. 4 illustrates a perspective view of patterning a plurality of layers at a time.

Referring to FIG. 3, since a layer on a mother substrates is patterned one by one while the mother substrate moves in left/right directions upon patterning a layer on the mother substrate having a plurality of substrates by applying a laser beam to a laser pattern mask 20 by using an optical system of 1:3, a stitching error takes place, and a tack time increases to make a yield poor.

Therefore, referring to FIG. 4, if an entire layer on the mother substrate is patterned at a time by applying a laser beam to the laser pattern mask 120 by using an optical system of 1:1, it is possible to prevent the stitching error from taking place.

However, since a ratio of energy applied to the laser pattern mask 120 to energy applied to the layer is $1/3^2:1$ if the optical system of 1:3 is used, though the laser pattern mask 120 is not damaged because the energy of the laser beam applied to the laser pattern mask 120 is not great, since the ratio of the energy applied to the laser pattern mask 120 to the energy applied to the layer is $1/1^2:1$ (1:1) if the optical system of 1:1 is used, the energy of the laser beam applied to the laser pattern mask 120 can damage the laser pattern mask 120.

Therefore, the present invention can prevent the laser pattern mask from being damaged by the laser beam as well as a laser shielding pattern from reacting with oxygen in air even if the layer on the mother substrate is patterned at a time by using the laser pattern mask having a protective film formed on an entire surface of the base substrate including the laser shield pattern of a material having high reflectivity formed on the base substrate.

The laser pattern mask of the present invention will be described with reference to the attached drawings.

FIG. 5 illustrates a section of a laser pattern mask in accordance with a preferred embodiment of the present invention.

Referring to FIG. 5, the laser pattern mask of the present invention includes a base substrate 230, a laser shielding pattern 230 formed on the base substrate 200 to have opened regions, and a protective film 240 formed on the base substrate 200 including the laser shielding pattern 230.

The base substrate 200 is formed of quartz having good transmissivity.

And, if the laser shielding pattern 230 is formed of a material having high laser absorptivity, the laser shielding pattern 230 is liable to be damaged due to absorption of the laser energy. Therefore, by forming the laser shielding pattern 230 of a non-transparent metal having high laser reflectivity, the damage caused by the laser beam can be reduced. It is preferable that the metal having high laser reflectivity of the laser shielding pattern 230 can be selected from Al, Ag and Au.

And, the laser shielding pattern 230 has opened regions which are laser pass through regions.

In the meantime, if the laser shielding pattern 230 has a structure in which the laser shielding pattern 230 is exposed to air directly, the direct contact of the laser shielding pattern 230 to the oxygen in the air can cause thermal oxidation thereof during the laser ablation process, causing a poor laser shielding capability of the laser shielding pattern 230 due to thermal oxidation and expansion, as well as a poor adhesion of the laser shielding pattern 230 to the base pattern 200.

Therefore, the present invention forms a protective film 240 on an entire surface of the base substrate 200 including the laser shielding pattern 230.

The protective film 240 is formed of a material, such as $MgF_2$ and $SiO_2$ for serving to make reaction between the oxygen in the air and the laser shielding pattern 230 minimum, preventing the laser shielding pattern 230 from being damaged even if the energy identical to the laser energy applied to the layer on the mother substrate is applied to the laser shielding pattern 230.

In this instance, the material of the laser shielding pattern 230 and the material of the protective film 240 can vary with wavelength of the laser beam.

FIG. 6 illustrates a table showing a test result of reflectivity of the laser pattern mask in accordance with a preferred embodiment of the present invention.

Referring to FIG. 6, if the laser shielding pattern is formed of Al, and the protective film is formed of $MgF_2$ for the laser beam with a wavelength of 250 nm ~700 nm, the laser pattern mask has reflectivity of over 85%, and if the laser shielding pattern is formed of Al, and the protective film is formed of $SiO_2$ for the laser beam with a wavelength of 400 nm~10 µm, the laser pattern mask has reflectivity of over 90%. And, if the laser shielding pattern is formed of Ag, and the protective film is formed of $SiO_2$ for the laser beam with a wavelength of 600 nm~10 µm, the laser pattern mask has reflectivity of over 95%.

Therefore, even if the layer on the mother substrate is patterned at a time by using the optical system of 1:1, the damage to the laser shielding pattern can be prevented since the reflectivity of the laser pattern mask is high enough to reflect the laser energy applied to the mother substrate, adequately.

A method for fabricating a laser pattern mask in accordance with a preferred embodiment of the present invention will be described with reference to the attached drawings.

FIGS. 7A~7E illustrate sections showing the steps of a method for fabricating a laser pattern mask in accordance with a preferred embodiment of the present invention.

Referring to FIG. 7A, a laser shielding layer 230a is formed on a base substrate 200, and photoresist 210a is coated on the laser shielding layer 230a.

Then, referring to FIG. 7B, in order to make the laser shielding layer 230a to have opened regions which are laser beam pass through regions, the photoresist 210a (See FIG. 7A) is subjected to exposure and development, to form a photoresist pattern 210. And, residual photoresist 7a (See FIG. 7A) can be removed from the opened regions by ashing or dry etching.

Figure 7C:
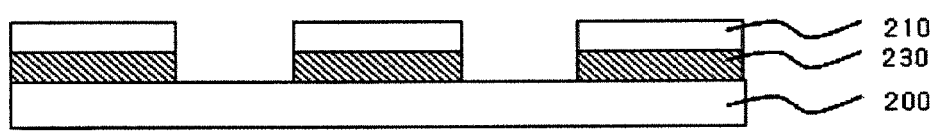

Referring to FIG. 7C, the laser shielding layer 230a (See FIG. 7B) is patterned by using the photoresist pattern 210 as a mask to form a laser shielding pattern 230.

Figure 7D:

In this instance, the laser shielding pattern 230 is formed by dry or wet etching, preferably by wet etching. Then, as shown in FIG. 7D, the photoresist pattern 210 (See FIG. 7C) is removed from above the laser shielding pattern 230.

Figure 7E:
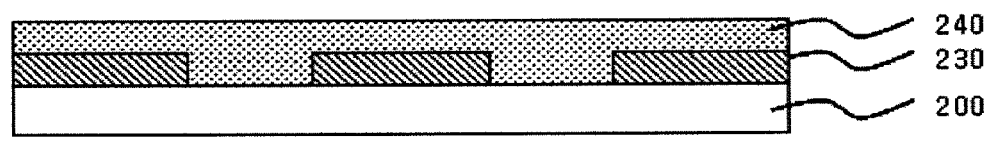

Then, referring to FIG. 7E, a protective film 240 is formed on an entire surface of the base substrate 200 including the laser shielding pattern 230.

The protective film 240 can be formed by CVD (Chemical Vapor Deposition), sputtering, or E-Beam process, preferably by the E-Beam process.

Thus, in the laser pattern mask of the present invention can prevent, when the entire layer on the mother substrate is patterned at a time, the protective film formed on an entire surface of the base substrate including the laser shielding pattern can prevent the laser pattern mask from being damaged by the laser beam as well as the laser shielding pattern from making reaction with oxygen in the air.

And, since the laser shielding pattern is liable to be damaged because the laser shielding pattern absorbs the laser beam energy if the laser shielding pattern is formed of a material having high laser absorptivity, the laser shielding pattern is formed of one of opaque metals having high reflectivity to reduce the damage caused by the laser beam.

Eventually, since the entire layer on the mother substrate is patterned at a time when the flat display device is fabricated by using the laser pattern mask of the present invention, the tack time can be reduced to improve a yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As has been described, the laser pattern mask, and the method for fabricating the same of the present invention has the following advantages.

First, the formation of the laser shielding pattern of a material having high reflectivity on the base substrate of the laser pattern mask permits to reduce damage to the laser pattern mask caused by the laser beam even if the laser pattern mask has laser energy the same with laser energy applied to the layer.

Second, the protective film formed on the base substrate including the laser shielding pattern permits to reduce damage to the laser shielding pattern caused by the laser beam as well as prevent damage to the laser shielding pattern caused by reaction of the laser shielding pattern with oxygen in air.

What is claimed is:

1. A laser pattern mask comprising;
    a base substrate;
    a laser shielding pattern formed of an opaque metal on the base substrate to define laser beam pass through regions; and
    a protective film formed on an entire surface of the base substrate including the laser shielding pattern;
    wherein the laser shielding pattern is formed of Ag and the protective film is formed of $SiO_2$,
    wherein an entire layer on a mother substrate is patterned at a time by applying a laser beam to the laser pattern mask, and
    wherein the protective film formed on the laser beam pass through regions is flush with the protective film formed on the laser shielding pattern.

2. A method for fabricating a laser pattern mask comprising the steps of:
    forming a laser shielding pattern of an opaque metal on a base substrate to define laser beam pass through regions; and
    forming a protective film on an entire surface of the base substrate including the laser shielding pattern;
    wherein the laser shielding pattern is formed of Ag and the protective film is formed of $SiO_2$,
    wherein an entire layer on a mother substrate is patterned at a time by applying a laser beam to the laser pattern mask, and
    wherein the protective film formed on the laser beam pass through regions is flush with the protective film formed on the laser shielding pattern.

3. The method as claimed in claim 2, wherein the step of forming a laser shielding pattern includes the steps of
    forming a laser shielding layer on the base substrate and coating photoresist on the laser shielding layer;
    subjecting the photoresist to exposure and development to form a photoresist pattern to have the laser beam pass through regions;
    removing residual photoresist from the laser beam pass through the regions;
    patterning the laser shielding layer by using the photoresist pattern to form the laser shielding pattern; and
    removing the photoresist pattern.

4. The method as claimed in claim 3, wherein the step of removing the residual photoresist from the laser beam pass through regions includes the step of using ashing or dry etching.

5. The method as claimed in claim 3, wherein the step of forming the laser shielding layer includes the step of using wet etching.

6. The method as claimed in claim 2, wherein the step of forming a protective film includes the step of using one process selected from Chemical Vapor Deposition (CVD), sputtering, and E-Beam.

* * * * *